United States Patent
Kolodziej

(10) Patent No.: US 6,344,613 B1
(45) Date of Patent: Feb. 5, 2002

(54) AUTOMOBILE ELECTRICAL CIRCUIT ASSEMBLY WITH TRANSPARENT PROTECTIVE COVER

(75) Inventor: Michael M. Kolodziej, Brighton, MI (US)

(73) Assignee: Visteon Global Technologies, Inc., Dearborn, MI (US)

( * ) Notice: Subject to any disclaimer, the term of this patent is extended or adjusted under 35 U.S.C. 154(b) by 0 days.

(21) Appl. No.: 09/298,077

(22) Filed: Apr. 22, 1999

(51) Int. Cl.⁷ ................................................ H02G 3/00
(52) U.S. Cl. ...................... 174/72 A; 174/254; 174/268; 439/77; 296/70; 307/10.1
(58) Field of Search ........................... 174/72 A, 72 B, 174/72 R, 72 TR, 88 B, 99 B, 177 FF, 254, 255, 268; 439/77, 426

(56) References Cited

U.S. PATENT DOCUMENTS

| | | | |
|---|---|---|---|
| 2,824,901 A | * 2/1958 | Reichert et al. ............... 174/72 |
| 2,906,808 A | * 9/1959 | Krauss ........................ 174/72 |
| 2,963,626 A | * 12/1960 | Du Val et al. ................. 317/99 |
| 3,070,650 A | * 12/1962 | Stearns ......................... 174/88 |
| 3,074,043 A | * 1/1963 | Stearns et al. ............... 339/148 |
| 3,264,403 A | * 8/1966 | Erdle ........................... 174/72 |
| 3,448,355 A | * 6/1969 | Ahearn et al. ............... 317/261 |
| 3,665,370 A | 5/1972 | Hartmann |
| 3,725,843 A | 4/1973 | Johnson |
| 3,950,057 A | 4/1976 | Calabro |
| 4,015,328 A | * 4/1977 | McDonough ............... 174/68.5 |
| 4,426,548 A | * 1/1984 | Oritsuki et al. ............ 174/72 R |
| 4,548,451 A | 10/1985 | Benarr et al. |
| 4,794,269 A | * 12/1988 | Kawata et al. ............ 307/10 R |
| 4,831,278 A | * 5/1989 | Ueda et al. ................. 307/10.1 |
| 4,834,660 A | 5/1989 | Cotti |
| 4,846,699 A | 7/1989 | Glover et al. |
| 5,059,129 A | 10/1991 | Brodsky et al. |
| 5,096,431 A | 3/1992 | Byrne |
| 5,099,393 A | 3/1992 | Bentlage et al. |
| 5,156,558 A | 10/1992 | Belanger, Jr. |
| 5,171,159 A | 12/1992 | Byrne |
| 5,288,141 A | 2/1994 | Isshiki et al. |
| 5,447,451 A | 9/1995 | Bishop |
| 5,536,176 A | 7/1996 | Borchew et al. |
| 5,540,597 A | 7/1996 | Budman et al. |
| 5,541,366 A | * 7/1996 | Maoz et al. .................. 174/258 |
| 5,541,369 A | * 7/1996 | Tahara et al. ............... 174/268 |
| 5,555,490 A | 9/1996 | Carroll |
| 5,574,270 A | 11/1996 | Steffen |
| 5,594,627 A | 1/1997 | Le |
| 5,633,480 A | * 5/1997 | Sato et al. ................... 174/255 |
| 5,679,018 A | 10/1997 | Lopata et al. |
| 5,703,760 A | 12/1997 | Zhu |
| 5,707,245 A | 1/1998 | Yamamoto et al. |
| 5,813,878 A | 9/1998 | Kuwata et al. |
| 6,000,949 A | * 12/1999 | Takiguchi et al. ............ 439/34 |
| 6,048,020 A | * 4/2000 | Gronowicz et al. ........... 296/70 |

FOREIGN PATENT DOCUMENTS

| | | | | |
|---|---|---|---|---|
| EP | 5434659 A2 | * | 3/1993 | ............... 174/72 A |
| GB | 1177275 | * | 1/1970 | ............... 174/72 A |
| GB | 1193420 | * | 6/1970 | ............... 174/72 A |
| GB | 1287074 | * | 8/1972 | ............... 174/72 A |
| GB | 2275373 | * | 8/1994 | ............... 174/72 TR |
| JP | 2-220941 | * | 9/1990 | ............... 174/72 A |
| JP | 5-105011 | * | 4/1993 | ............... 174/72 A |
| JP | 5-120922 | * | 5/1993 | ............... 174/72 A |
| JP | 6-289922 | * | 2/1994 | ............... 174/72 A |
| JP | 6-251637 | * | 9/1994 | ............... 174/72 TR |

* cited by examiner

Primary Examiner—Dean A. Reichard
Assistant Examiner—Adolfo Nino
(74) Attorney, Agent, or Firm—Larry I. Shelton

(57) ABSTRACT

The present invention provides an automotive circuit assembly having a plurality of circuit segments. Each circuit segment has one or more conductive buses operatively positioned between a dielectric substrate and a protective cover. The protective cover selectively exposes a portion of the one or more conductive buses. The one or more conductive buses of one circuit segment is selectively joined to one or more conductive buses of another circuit segment to cooperatively form an electrical circuit assembly.

20 Claims, 3 Drawing Sheets

AUTOMOBILE ELECTRICAL CIRCUIT ASSEMBLY WITH TRANSPARENT PROTECTIVE COVER

FIELD OF THE INVENTION

This invention relates to automobile electrical circuit assemblies, and more particularly to an automobile circuit assembly having substantially flat and rectangular segments which may be selectively connected to cooperatively form a desired circuit assembly.

BACKGROUND OF THE INVENTION

Circuit assemblies are used within automobiles to selectively connect the various electrical components and/or modules of the automobile with a source of electrical power and/or with relays, fuses, and other types of electrical devices or signals. Typically these circuit assemblies are formed and created by the use of several relatively bulky wire harnesses which are typically and manually installed within and which traverse through the automobile, such as along the "cross car beam" within the instrument panel. Each of the harnesses typically contain a bundle of insulated wires which are wrapped in tape, foam, or other types of protective cover materials and which are selectively spliced, crimped, and/or connected to various other wires within the same harness or to various wires contained within the other harnesses. The harness wires are selectively connected to the various automobile components and/or modules by the use of separate "pigtail" type wire connector assemblies which typically and orthogonally project from each of the harnesses and which provide a connecting "bridge" between the harness and the selected components. These harnesses suffer from various drawbacks.

Particularly, these harnesses require a relatively large amount of installatation time and effort, thereby increasing the overall cost of producing an automobile. The relatively bulky harnesses require a relatively large amount of space, thereby undesirably prohibiting an enlargement of some of the automotive components, such as the air conditioning vents. The required wire splicing and "pigtail" assemblies reduce the overall integrity of the circuit assembly making it prone to failure and malfunction. Moreover, the detection, isolation, and correction of associated circuitry faults is difficult due to the rather bulky arrangement of the insulated wires within the harness and due to the use of complicated splicing and "pigtail" type connections. Further, each of these harnesses is typically configured for a unique type or model of automobile. Hence, new harness designs are required for substantially every new automobile model and for every change made to an existing model, thereby reducing the overall cost of automobile production.

There is therefore a need for an automotive circuit assembly which is relatively easy to install within an automobile; which is relatively compact; which allows circuits to be relatively easily and efficiently formed; which allows the formed circuits to be relatively easily and directly connected to a component; which allows circuit faults and malfunctions to be relatively easily identified and corrected; and which may be used by a wide variety of automobiles. Applicant's invention addresses these and other needs.

SUMMARY OF THE INVENTION

It is a first object of the invention to provide an automotive circuit assembly which overcomes the various previously delineated drawbacks of prior automotive circuit assemblies.

It is a second object of the invention to provide an automotive circuit assembly which allows circuits to be relatively easily and selectively created and installed within an automobile, and which may be selectively and directly connected to an automotive component and/or module.

It is a third object of the invention to provide a circuit assembly having a portion which allows for the relatively efficient detection, isolation, and correction of circuit and/or conductor faults.

According to a first aspect of the present invention, an automotive electrical circuit assembly is provided. The assembly includes a plurality of substantially rectangular and flat circuit segments, each of the circuit segments having a plurality of conductive busses operatively positioned between a dielectric substrate and a protective cover and being adapted to be selectively interconnected to cooperatively form an electrical circuit assembly.

According to a second aspect of the present invention, a method for creating automobile circuits is provided. The method includes the steps of providing a plurality of rectangular flat circuit segments, each of the circuit segments including a dielectric substrate containing a plurality of electrically conductive busses and a transparent protective membrane which overlays the electrically conductive busses; selecting at least a first and a second of the rectangular circuit segments; removing at least a portion of the protective membrane of a first of the rectangular segments to expose a first portion of one of the electrically conductive busses of the first rectangular segment; removing at least a portion of the membrane of a second of the rectangular segments to expose at least one of the electrically conductive busses of the second rectangular segment; orthoganally coupling the at least one of the electrically conductive busses of the first rectangular segment to the at least one of the electrically conductive busses of the second rectangular segment, thereby creating an electrical circuit.

These and other features, aspects, and advantages of the present invention will become apparent from a reading of the specification and by reference to the following drawings.

BRIEF DESCRIPTION OF THE DRAWINGS

FIG. 7 is a perspective view of a circuit segment made in accordance with the teachings of an alternate embodiment of

DETAILED DESCRIPTION OF THE PREFERRED EMBODIMENT OF THE INVENTION

Figure 1:
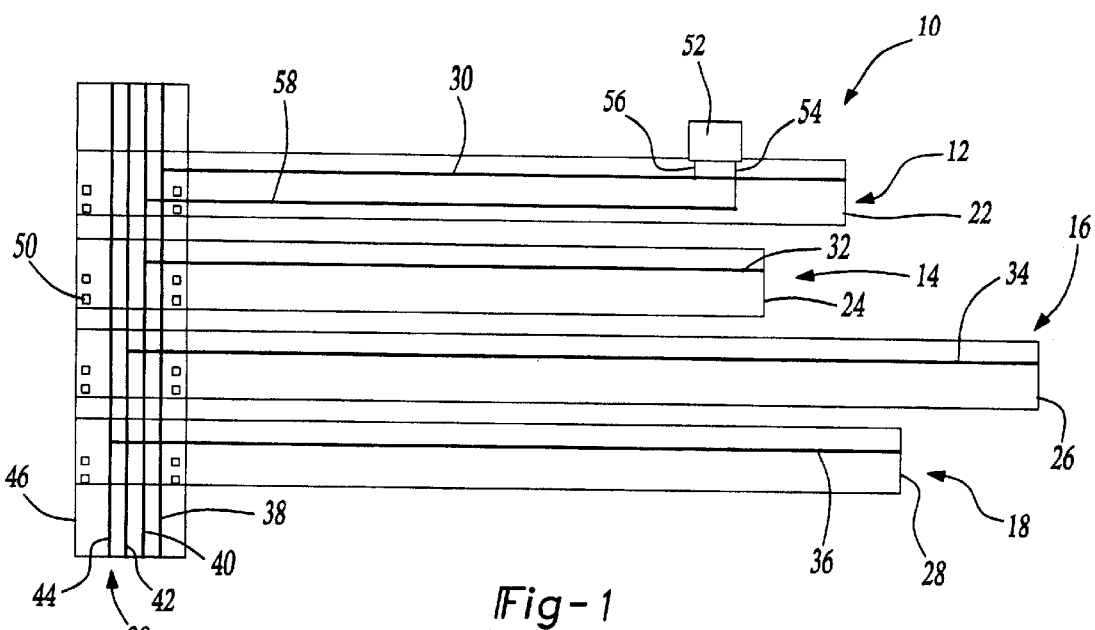
FIG. 1 is a plan view of the interconnection of several circuit segments which selectively and cooperatively form a circuit assembly made in accordance with a first embodiment.
Figure 5:
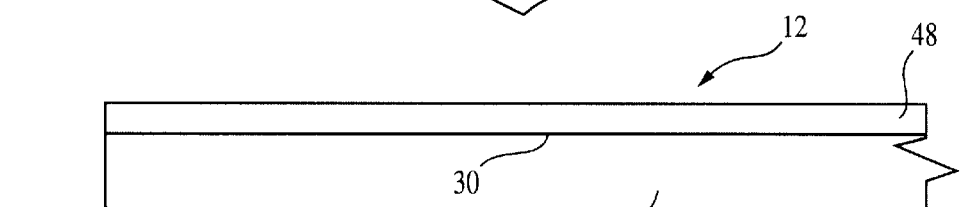
FIG. 5 is an exploded side view of one of the circuit segments shown in FIG. 1.

Referring now to FIGS. 1 and 5, there is shown an electrical circuit assembly 10 made in accordance with a first embodiment. Assembly 10 includes generally flat and rectangular circuit segments 12, 14, 16, 18, and 20. Each segment 12–18 has a substantially identical dielectric substrate 22, 24, 26, and 28 and at least one respective conductive bus or wire 30, 32, 34, and 36, formed of copper or some other electrically conductive material and which is operatively positioned upon respective substrates 22–28. Segment 20 includes four conductive busses 38, 40, 42, and 44 which are operatively deployed upon substrate 46. Each segment 12–20 further includes a substantially identical transparent protective membrane or cover 48 which substantially overlays the respective substrates 22–28 and 46 and the conductors 30–44. In one non-limiting embodiment of the invention, each substrate is formed from a commercially available polyester material, such as those substrates commonly known as "PET" or "PEN", which are provided by the Sheldahl Corporation, while membrane 48 is formed from a commercially available copper-polyester laminate material which is also provided by the Sheldahl Corporation.

Small portions of each of the respective protective covers 48 overlaying each of the conductors 30–44 are removed, thereby selectively exposing a small portion of each of the conductors 30–44. The selected exposed portions of these conductors 30–44 are joined in the manner shown in FIG. 1 (e.g., conductors 30–36 are respectively coupled to conductors 38–44) by the use of soldering, welding, or other types of electrical connection methodologies. Moreover, connection pins 50 are placed through each pair of mated segments 12, 20; 14, 20; 16, 20; and 18, 20 further ensuring the continued integrity of the conductor couplings. In this manner, a circuit assembly 10 is formed by the selective interconnection of several substantially flat and generally rectangular circuit segments 12–20.

Automobile modules or components, such as power door lock motor assembly 52 (see FIGS. 1 and 7) having a pair of electrical terminals 54, 56, may be selectively and directly connected to certain portions of assembly 10, such as to the conductive busses 30 and 58 of segment 12. Particularly, a small portion of the protective membrane 48 is removed from each of the conductors 30, 58 in the vicinity of module 52. Terminals 56 and 54 are respectively soldered to conductors 58 and 30 which electrically and cooperatively couple module 52 to conductors 38 and 40 of segment 20. In this non-limiting embodiment, conductors 38 and 40 respectively represent an electrical power and an electrical ground "source". No intermediate "pigtail" connection is necessary to connect module 52 to these conductors 30, 58 (or to any of the other conductors 32–44 of assembly 10), thereby reducing the probability of electrical malfunction or failure and markedly improving upon the reliability of prior circuit assemblies. In another embodiment, module 52 represents a fuse. In the configuration, a selected number of fuses 52 may be operatively deployed upon these segments 12–20 in order to cooperatively replace a conventional junction box.

Figure 6:
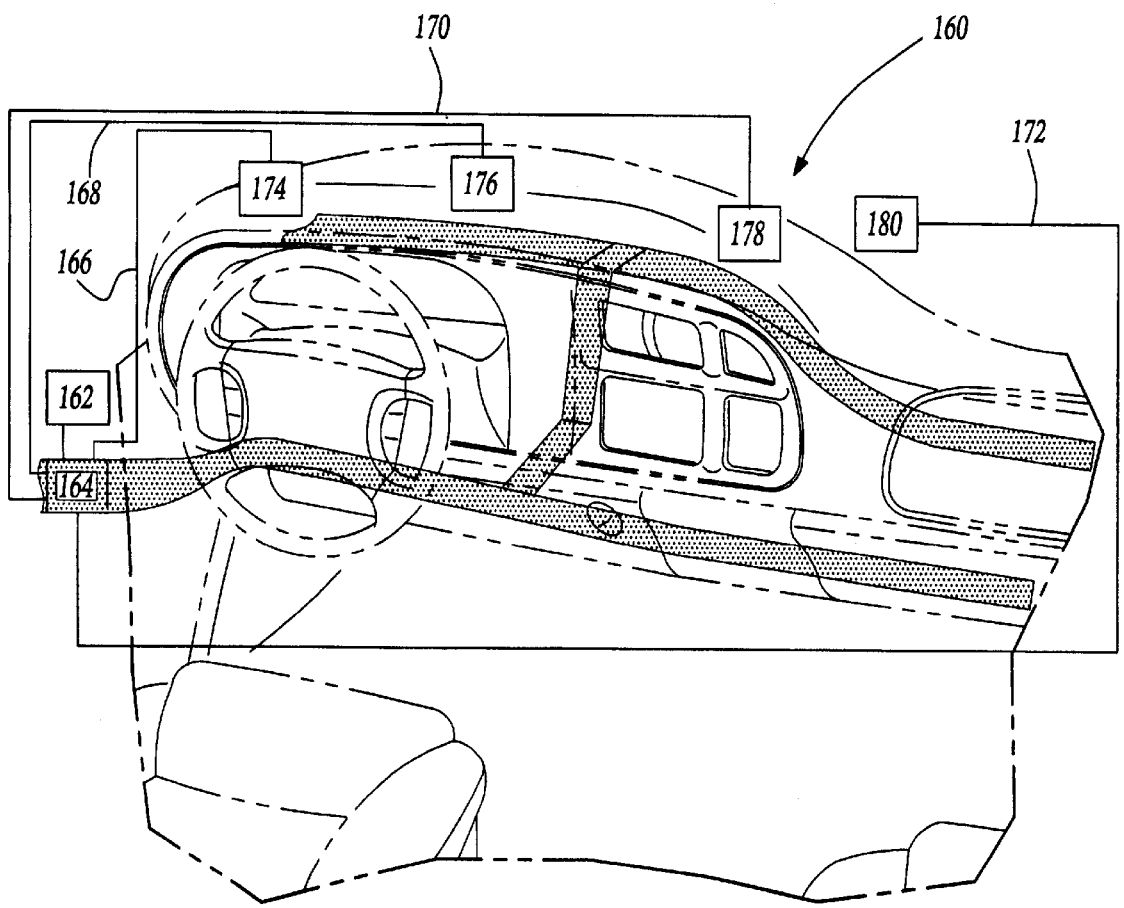
FIG. 6 is a fragmented perspective view of an automobile instrument panel containing a circuit assembly made in accordance with the teachings of the preferred embodiment of the invention.

These relatively flat interconnected circuit segments are also relatively efficiently installed within an automobile, requiring substantially less mounting space than prior harnesses. Importantly, these flat rectangular segments 12–20 allow for relatively straight circuit segment "runs" to be made from one or more "backbone" segments (e.g., segments which contain electrical power and ground signals which are to be distributed to components and modules throughout the automobile and/or which are integrally formed within a protective fuse assembly), such as segment 20, to the various modules or central centers, such as module 52, thereby substantially minimizing the total circuit segment length of assembly 10 and concomitantly reducing material and installation costs. One such segment run is illustrated within instrument panel 160 of FIG. 6. As shown, relay and fuse assembly 162 is connected to a segment 164. This "backbone" segment 164 is connected to segments 166, 168, 170, and 172 which respectively terminate within and are connected to the instrument cluster 174, the steering wheel stalk 176, the audio and air conditioning center 178, and the remainder of the vehicle components, shown as 180. Further, these segments 164–172 may be selectively interconnected in a variety of desired configurations, thereby being adapted for use in a wide variety of automobiles.

Notwithstanding the assembly shown in FIG. 1, it should be appreciated that other circuit assemblies may be configured having different numbers and/or lengths of segments 12–20 and having segments containing different numbers and/or types of conductors 30–44. Hence, these rectangular circuit segments 12–20 are "building blocks" which allow for the selective creation of a circuit assembly of a selected and desired size and shape. Moreover, some of the selectively coupled conductors, such as conductors 30 and 38, are not of the same weight or cross sectional area. Rather, conductors having dissimilar weights and associated cross sectional areas may be selectively and directly connected as shown (see FIG. 2) by the coupling of conductor 60 of circuit segment 62 to conductor 64 of circuit segment 66. As shown, the weight and cross sectional area of conductor 60 is substantially greater than that of conductor 64. These dissimilar conductors may be directly connected further facilitating the connection of many diverse types of components or modules to a "backbone" segment 66. The formed dissimilar conductor connection is constrained to carry no amount of electrical current greater than the current carrying capacity of the conductor having the lowest weight and cross sectional area and to no more current than that allowed by a conductor having the largest available weight.

Figure 2:
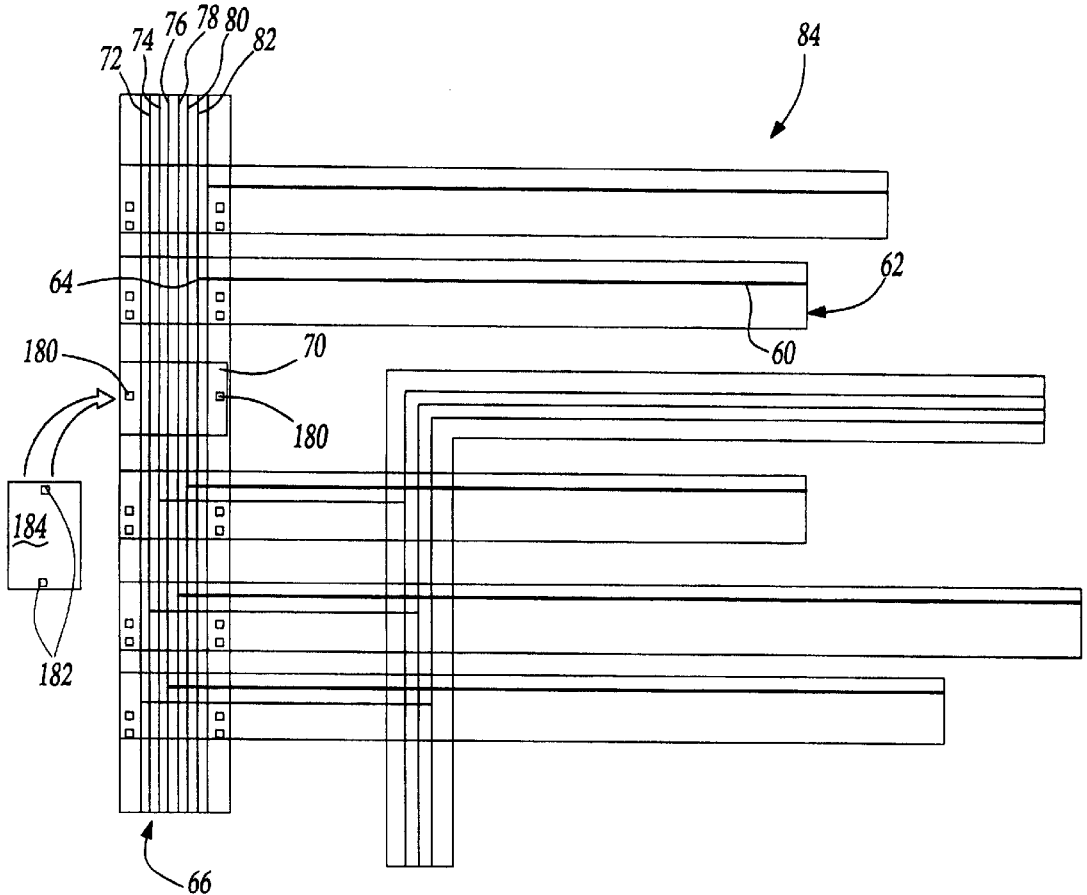
FIG. 2 is a plan view of the interconnection of several circuit segments which selectively and cooperatively form a circuit assembly which is made in accordance with a second embodiment and which further includes a service interface portion.
Figure 7:
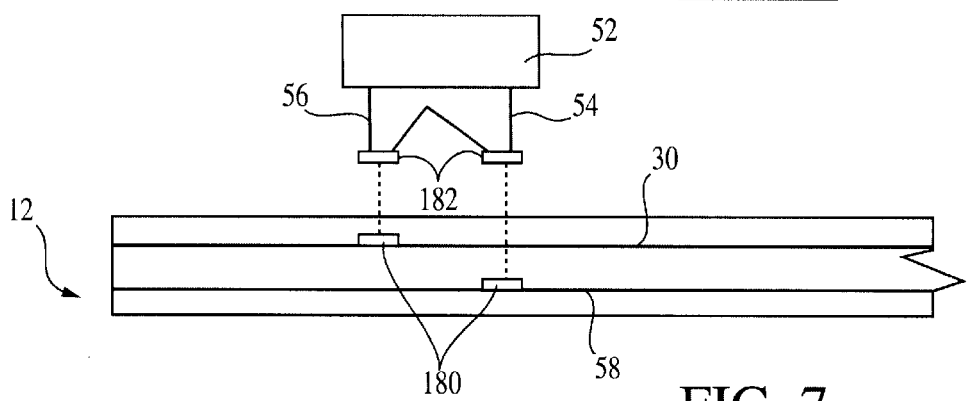

FIG. 2 shows an electrical circuit assembly 84 in accordance with a second embodiment. A service portion 70 may be selectively created in one or more circuit segments, such as circuit segment 66. Particularly, service portion 70 is formed by removing the protective cover 48 of one or more of the conductive busses 72–82 of the segment 66. The area may remain exposed allowing for the connection of electronic testing and/or diagnostic equipment to be made to these busses 72–82 and to all other busses to which they are connected. In this manner efficient "troubleshooting" of assembly 84 may be accomplished. Alternatively, portion 70 may include several conventional receptacles 180 positioned upon opposed sides of the conductors 72–82 and adapted to removably receive mating plugs 182 formed upon a removable protective cover 184. In this manner, conductors 72–82 are protected by the removable protective cover 184 until service and/or testing is required. FIG. 7 shows an automobile module or component selectively coupled to a circuit segment in accordance with an alternate embodiment. The terminals 54 and 56 of module 52 may also individually and respectively terminate within conventional plugs 182. In this embodiment, busses 30 and 52 terminate within receptacles 180, thereby allowing terminals 54 and 56 to be easily and selectively coupled to the busses 54 and 56 as plugs 182 removably mate with receptacles 182. All of the automobile modules and components may be similarly configured to efficiently and easily mate with circuit segments 12, 20.

Figure 3:
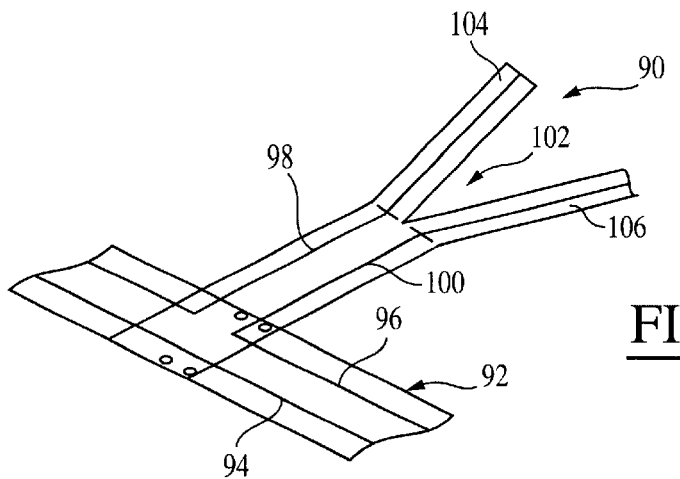
FIG. 3 is a perspective view of the interconnection of two circuit segments, in accordance with a third embodiment one of the segments having two substantially identical partially detached portions.
Figure 4:
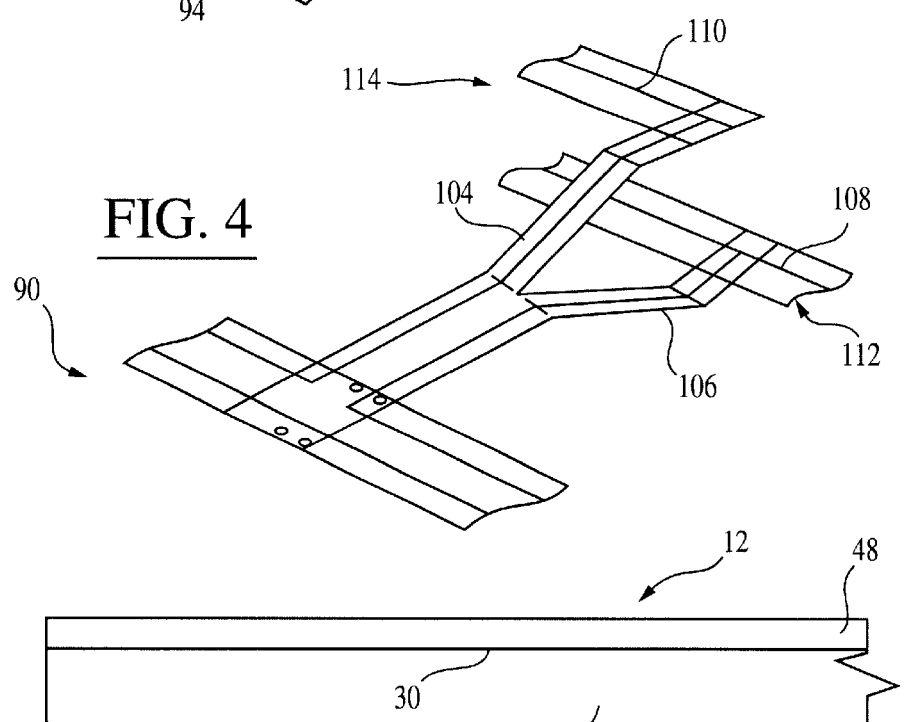
FIG. 4 is a view similar to FIG. 3 but illustrating the interconnection of the partially detached circuit portions to other circuit segments.

Referring now to FIGS. 3–4, there is shown an electrical circuit assembly 90 in accordance with a third embodiment. The electrical circuit assembly 90 has a first circuit segment 92, including conductive busses 94, 96 which are respectively coupled to conductive busses 98, 100 of circuit segment 102. Particularly, a portion of segment 102 is longitudinally severed allowing for the creation of movably detached circuit segments 104, 106 which may be selectively coupled to busses 108, 110 of respective circuit segments 112, 114 (see FIG. 4). The selective severing of circuit segment 90 allows the segment to efficiently conform to the shape of the automobile, thereby allowing for relatively efficient installation.

It is understood that the invention is not limited to the exact construction or method illustrated and described above, but that various changes may be made without departing from the spirit and the scope of the invention as delineated within the following claims.

What is claimed is:

1. An automobile circuit assembly comprising:
    a first circuit segment having a first conductive bus, a first dielectric substrate, and a first transparent protective cover, where the first conductive bus is operatively disposed on the first dielectric substrate, where the first transparent protective cover overlays the first conductive bus and the first dielectric substrate, where the first transparent protective cover selectively exposes a first portion of the first conductive bus, and where the first conductive bus has a first width and a first weight; and
    a second circuit segment having a second conductive bus, a second dielectric substrate, and a second transparent protective cover, where the second conductive bus is operatively disposed on the second dielectric substrate, where the second transparent protective cover overlays the second conductive bus and the second dielectric substrate, where the second transparent protective cover selectively exposes a second portion of the second conductive bus, and where the second conductive bus has a second width and a second weight, and
    where the second portion of said second conductive bus is joined to the first portion of said first conductive bus.

2. The automobile circuit assembly of claim 1 further comprising:
    a source of electrical power coupled to one of said first conductive bus and said second conductive bus; and
    an automobile component coupled to one of said first conductive bus and said second conductive bus.

3. The automobile circuit assembly of claim 1 further comprising:
    a removable protective cover disposed on a service portion formed by one of said first and second transparent protective covers.

4. The automobile circuit assembly of claim 1,
    where said second portion further comprises a third conductive bus, where the third conductive bus is operatively disposed on the second dielectric substrate, where the second transparent protective cover overlays the third conductive bus, where the second transparent protective cover selectively exposes a third portion of the third conductive bus, and where the third conductive bus has a third width and a third weight,
    where the first transparent protective cover selectively exposes a fourth portion of the first conductive bus, and
    where the third portion of said third conductive bus is joined to the fourth portion of said first conductive bus.

5. The automobile circuit assembly of claim 1, where at least one of the first conductive bus and the second conductive bus comprises copper.

6. The automobile circuit assembly of claim 1, where at least one of the first width and the first weight is different than the second width and second weight, respectively.

7. The automobile circuit assembly of claim 1, where the second conductive bus is joined to the first conductive bus of by one of soldering and welding.

8. The automobile circuit assembly of claim 1, where the second conductive bus of is orthogonally joined to the first conductive bus.

9. The automobile circuit assembly of claim 1, where the first circuit segment is orthogonally connected to the second circuit segment.

10. The automobile circuit assembly of claim 1, further comprising at least one connection pin disposed to connect said first circuit segment and said second circuit segment.

11. The automobile circuit assembly of claim 1, further comprising:
    a third portion having a third conductive bus, a third dielectric substrate, and a third transparent protective cover, where the third conductive bus is operatively disposed on the third dielectric substrate, where the third transparent protective cover overlays the third conductive bus and the third dielectric substrate, where the third transparent protective cover selectively exposes a third portion of the third conductive bus, and where the where the third conductive bus has a third width and a third weight,
    where the first transparent protective cover selectively exposes a fourth portion of the first conductive bus, and
    where the third portion of said third conductive bus is joined to the fourth portion of said first conductive bus.

12. An automotive electrical circuit assembly comprising:
    a plurality of substantially rectangular circuit segments, each of said circuit segments having a plurality of conductive busses operatively positioned between a dielectric substrate and a transparent protective membrane, each of said circuit segments being orthogonally connected,
    where the transparent protective membrane on one circuit segment exposes at least one conductive bus on the one circuit segment,
    where the transparent protective membrane on another circuit segment exposes at least another conductive bus on the other circuit segment, and
    where the at least one conductive bus on the one circuit segment is joined to the at least other conductive bus on the other circuit segment.

13. A method for creating an automobile circuit assembly comprising:
    providing a plurality of rectangular circuit segments, each of said rectangular circuit segments including a dielectric substrate containing a plurality of electrically conductive busses and a transparent protective cover which overlays said electrically conductive busses;
    selecting at least a first and a second of said rectangular circuit segments;
    exposing at least one of said electrically conductive busses of said first rectangular segment;

exposing at least one of said electrically conductive busses of said second rectangular segment; and orthogonally coupling said at least one of said electrically conductive busses of said first rectangular segment to said at least one of said electrically conductive busses of said second rectangular segment.

14. The method of claim 13, wherein said at least one of said electrically conductive busses of said first rectangular segment comprises copper having a first weight, and said at least one of said electrically conductive busses of said second rectangular segment comprises copper having a second weight.

15. The method of claim 13, further comprising:

exposing a service portion of at least one of said electrically conductive busses of said first rectangular segment;

providing a removable protective cover; and removably attaching said removable protective cover over said service portion of said one of said electrically conductive busses of said first rectangular segment.

16. The method of claim 15, where said exposing the service portion of at least one of said electrically conductive busses of said first rectangular segment further comprises:

removing a portion of said transparent protective cover of said first of said rectangular segments.

17. The method of claim 13, further comprising:

forming two movable circuit segments from said first rectangular circuit segment, the movable circuit segments each having at least one conductive bus.

18. The method of claim 17, where said forming two movable circuit segments further comprises:

selectively cutting said first rectangular circuit segment.

19. The method of claim 13, where said exposing at least one of said electrically conductive busses of said first rectangular segment further comprises:

removing at least a portion of said transparent protective cover of said first of said rectangular segments.

20. The method of claim 13, where said exposing at least one of said electrically conductive busses of said second rectangular segment further comprises:

removing at least a portion of said transparent protective cover of said second of said rectangular segments.

* * * * *

UNITED STATES PATENT AND TRADEMARK OFFICE
CERTIFICATE OF CORRECTION

PATENT NO.      : 6,344,613 B1
DATED           : February 5, 2002
INVENTOR(S)     : Michael M. Kolodziej Page 1 of 1

It is certified that error appears in the above-identified patent and that said Letters Patent is hereby corrected as shown below:

<u>Title page,</u>
Item [56], References Cited, FOREIGN PATENT DOCUMENTS, delete "5434659" and substitute -- 534659 -- in its place.

<u>Column 6,</u>
Line 33, delete "where the" first occurrence.

Signed and Sealed this

Twenty-fourth Day of September, 2002

*Attest:*

*Attesting Officer*

JAMES E. ROGAN
*Director of the United States Patent and Trademark Office*